(12) United States Patent
Kunishi et al.

(10) Patent No.: US 9,614,520 B2
(45) Date of Patent: Apr. 4, 2017

(54) SEMICONDUCTOR SWITCH

(71) Applicant: KABUSHIKI KAISHA TOSHIBA, Tokyo (JP)

(72) Inventors: Yugo Kunishi, Yokohama Kanagawa (JP); Toshiki Seshita, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/052,543

(22) Filed: Feb. 24, 2016

(65) Prior Publication Data
US 2016/0269025 A1 Sep. 15, 2016

(30) Foreign Application Priority Data
Mar. 13, 2015 (JP) .................. 2015-050694

(51) Int. Cl.
| | |
|---|---|
| *H03K 17/60* | (2006.01) |
| *H03K 17/687* | (2006.01) |
| *H03K 17/74* | (2006.01) |
| *H01L 23/66* | (2006.01) |
| *H03K 17/693* | (2006.01) |
| *H03K 17/06* | (2006.01) |

(52) U.S. Cl.
CPC ......... *H03K 17/6871* (2013.01); *H01L 23/66* (2013.01); *H03K 17/693* (2013.01); *H03K 17/74* (2013.01); *H01L 2223/6677* (2013.01); *H03K 2017/066* (2013.01); *H03K 2217/0018* (2013.01)

(58) Field of Classification Search
CPC .. H03K 17/6871; H03K 17/693; H03K 17/74; H03K 2217/0018; H03K 2017/066; H01L 23/66; H01L 2223/6677
See application file for complete search history.

(56) References Cited

U.S. PATENT DOCUMENTS

| | | | |
|---|---|---|---|
| 6,804,502 B2 | 10/2004 | Burgener et al. | |
| 8,975,950 B2 * | 3/2015 | Madan ................. | H03K 17/162 327/434 |
| 2012/0154016 A1 | 6/2012 | Kunishi et al. | |
| 2012/0154018 A1 | 6/2012 | Sugiura | |

FOREIGN PATENT DOCUMENTS

| | | |
|---|---|---|
| JP | 2000-294786 A | 10/2000 |
| JP | 2006310510 A | 11/2006 |

* cited by examiner

*Primary Examiner* — Kenneth B Wells
(74) *Attorney, Agent, or Firm* — Patterson & Sheridan, LLP (57) ABSTRACT

A semiconductor switch includes a plurality of metal-oxide-semiconductor field effect transistors (MOSFETs) and a pad. The MOSFETs are connected in series between a first node and a second node. The pad is provided above one or more of MOSFETs in the plurality without being provided above other MOSFETs in the plurality. The pad is connected to the first node. A value of an off capacitance (as determined without inclusion of any parasitic capacitance between the pad and the MOSFET) for each the MOSFETs under the pad is smaller than a value of an off capacitance of each of MOSFETs not under than the pad.

20 Claims, 12 Drawing Sheets

SEMICONDUCTOR SWITCH

CROSS-REFERENCE TO RELATED APPLICATION

This application is based upon and claims the benefit of priority from Japanese Patent Application No. 2015-050694, filed Mar. 13, 2015, the entire contents of which are incorporated herein by reference.

FIELD

Embodiments described herein relate generally to a semiconductor switch.

BACKGROUND

In a wireless communication device such as a mobile phone, in order to connect a transmitting circuit and a receiving circuit to an antenna, or to perform communication by switching among frequency bands, a high-frequency semiconductor switch, which is called a single-pole n-throw (SPnT) switch, is connected between the antenna and the transmitting receiving circuits. Examples of a switching element in the high-frequency semiconductor switch include a metal-oxide-semiconductor field-effect transistor (MOSFET) provided on a silicon-on-insulator (SOI) substrate.

In recent years, it has become possible to use various communication frequencies in such devices as mobile phones or the like, and thus the number of high-frequency components, such as the transmitting circuit, the receiving circuit, and filters which are included in a wireless communication device tends to increase so communication can be conducted using the various communication frequencies. Since the size of the wireless communication device is limited, miniaturization of these high frequency components is desirable.

DETAILED DESCRIPTION

In general, according to an embodiment, a semiconductor switch includes a first pad connected to a first node (such as a high frequency signal wiring). A plurality of metal-oxide-semiconductor field effect transistors (MOSFETs) are connected in series between the first node and a second node (such as common node connected to an antenna terminal). A first MOSFET in the plurality of MOSFETs is connected between the first node and a second MOSFET in the plurality of MOSFETs. The first pad is disposed above the first MOSFET. A first off state capacitance of the first MOSFET, that is determined without consideration of any parasitic capacitance between the first MOSFET and the first pad, is less than a second off state capacitance of the second MOSFET, that is determined without consideration of any parasitic capacitance between the second MOSFET and the first pad. Depending on the embodiment, the second MOSFET may be below the first pad or not.

In general, according to another embodiment, a semiconductor switch includes a plurality of MOSFETs and a pad. The plurality of MOSFETs is connected in series between a first node and a second node. The pad is provided above one or more of first MOSFETs without being provided above second MOSFETs, and is connected to the first node. A value of an off capacitance of each of the first MOSFETs (determined without consideration of parasitic capacitance between the MOSFET and the pad) is smaller than a value of an off capacitance of each of the second MOSFETs.

Hereinafter, the exemplary embodiments will be described with reference to the drawings. These example embodiments are provided for explanation of various aspects of the present disclosure and the scope of the present disclosure is not necessarily limited to these examples.

First Embodiment

Figure 1:
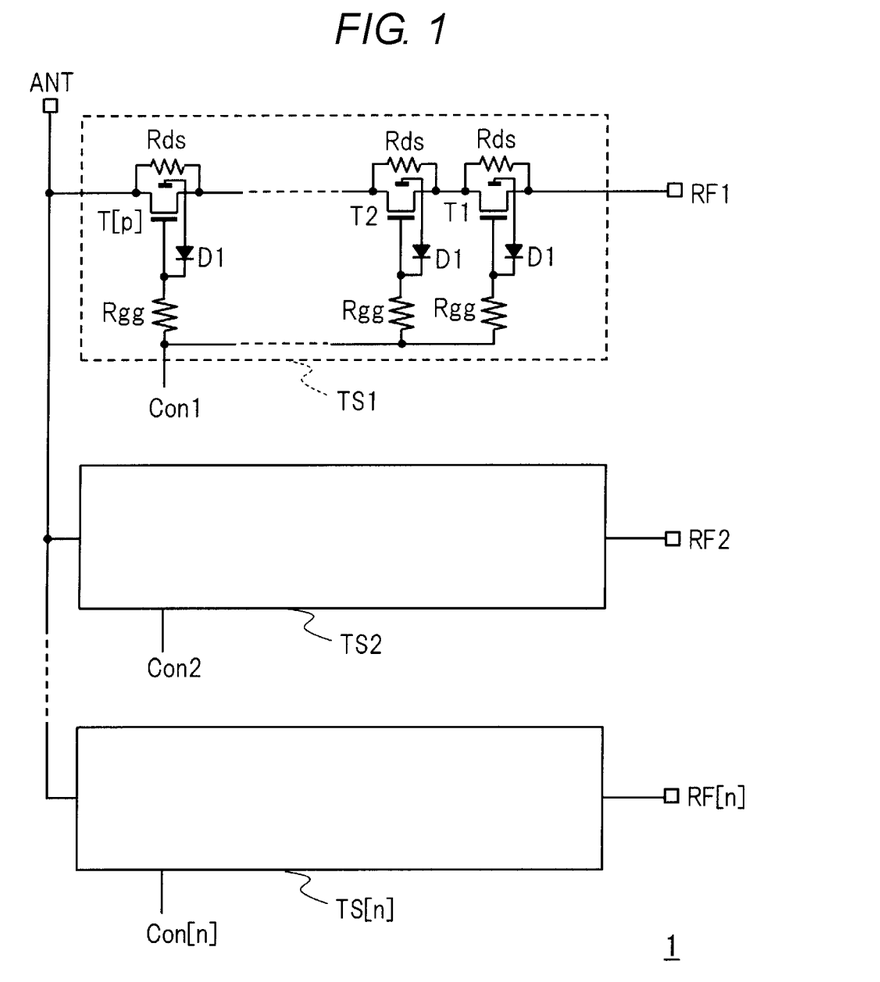
FIG. 1 is a circuit diagram of a semiconductor switch according to a first embodiment.

FIG. 1 is a circuit diagram of a semiconductor switch 1 according to the first embodiment. The semiconductor switch 1 is a single-pole n-throw (SPnT) switch which is provided on an SOI substrate. As illustrated in FIG. 1, the semiconductor switch 1 is provided with a first through-switch TS1 to an n-th through-switch TS[n] (here, n is an integer of 2 or more).

An i-th through-switch TS[i] switches whether to allow conduction between an i-th high-frequency signal terminal (an i-th node) RF[i] and an antenna terminal (a common node) ANT based on a control signal Con[i] (here, i is an integer 1 to n). Thus, as used here, each i-th through-switch TS[i] is connected between a corresponding i-th node RF[i] and the antenna terminal. Thus, second through-switch TS2 would be connected between the second node RF2 and the antenna terminal. A "node" in the present disclosure includes not only a physical signal connection point such as a port or a terminal, but also points on a wiring or a circuit connection having the same potential.

The antenna terminal ANT is connected to, for example, an antenna. For example, a transmitting circuit for transmitting a high-frequency signal or the receiving circuit for receiving a high-frequency signal is connected to high-frequency signal terminals RF1 to RF[n]. That is, each terminal RF[n] can be connected to a different circuit for transmitting and/or receiving signals.

The through-switch TS1 includes p MOSFETs T1 to T[p], p resistors Rgg, p resistors Rds, and p diodes D1 (as used in the foregoing, p designates an integer value of 2 or more (not a conductivity or channel type)). That is, the number of resistors Rgg, the number of resistors Rds, and the number of diodes D1 are the same and equal to the cumulative number of MOSFETs T1 to T[p] in the through-switch TS1.

The MOSFETs T1 to T[p] are provided on the semiconductor layer of the SOI substrate, and are connected in series between the high-frequency signal terminal RF1 and the antenna terminal ANT. The MOSFETs T1 to T[p] are connected from the high-frequency signal terminal RF1 in order (1 to p).

The resistor Rgg includes one end which is connected to each gate of the MOSFETs T1 to T[p] and the other end to which a control signal Con1 is supplied.

The resistor Rds is connected between a drain and a source in each of the MOSFETs T1 to T[p].

The diode D1 is a PN junction diode and is connected between a body and a gate of the MOSFETs T1 to T[p]. An anode of the diode D1 is connected to the body.

Each of the through-switches TS2 to TS[n] has the same configuration as that of the through-switch TS1.

For example, as the control signal Con1, when a potential (for example, about 3 V) of which the MOSFETs T1 to T[p] are in a conduction state (on state) is supplied to the gate in each of the MOSFETs T1 to T[p], the high-frequency signal terminal RF1 and the antenna terminal ANT are electrically connected to each other. At this time, as the control signals Con2 to Con[n] of the through-switches TS2 to TS[n] which are connected to other high-frequency signal terminals RF2 to RF[n], a potential (for example, about −3 V) of which the MOSFETs T1 to T[p] are in a non-conduction state (off state) is supplied to the gate in each of the MOSFETs T1 to T[p].

Figure 2:
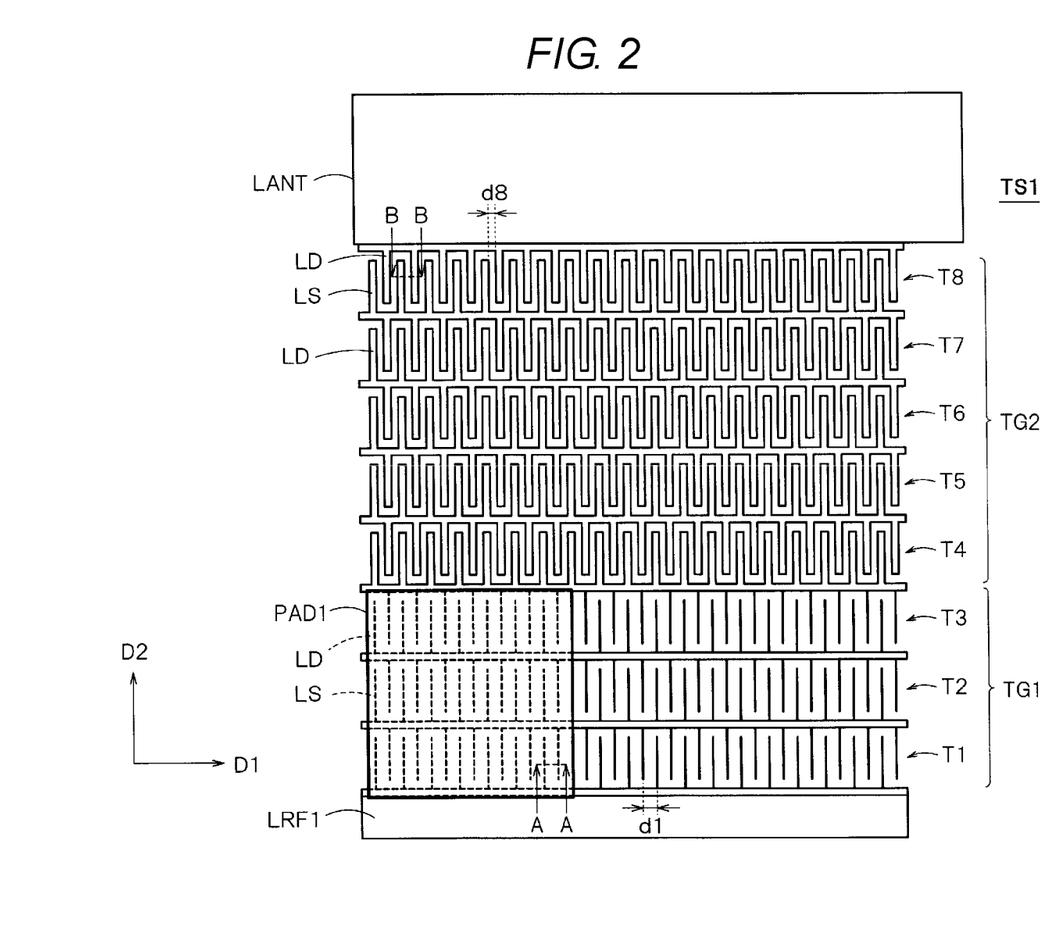
FIG. 2 is a plan view schematically illustrating a layout of a through-switch in the first embodiment.
Figure 3A:
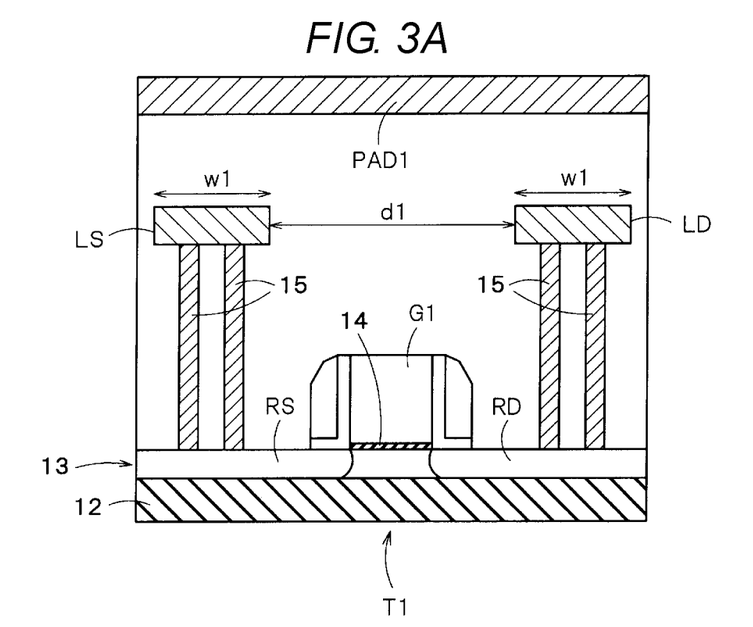
FIG. 3A is a cross sectional view taken along line A-A in FIG. 2.
Figure 3B:
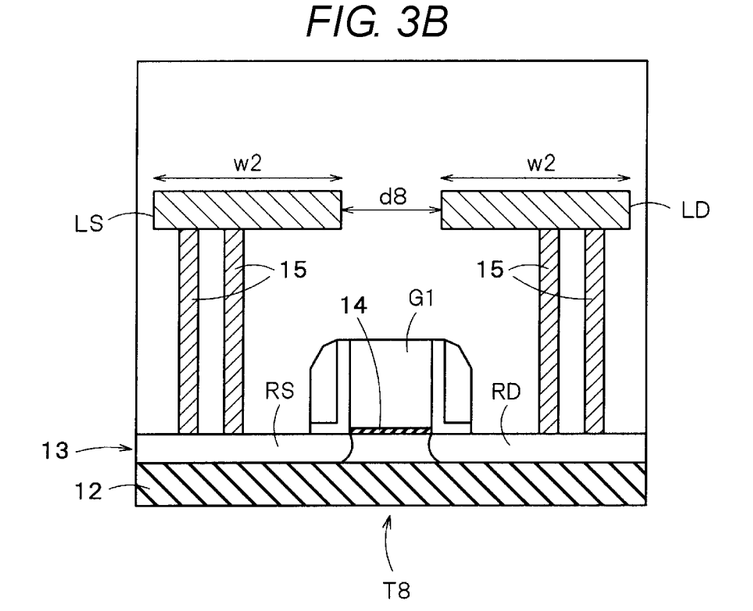
FIG. 3B is a longitudinal cross view taken along line B-B in FIG. 2.

FIG. 2 is a plan view schematically illustrating a layout of the through-switch TS1 illustrated in FIG. 1. FIG. 3A is a longitudinal sectional view taken along line A-A in FIG. 2, and FIG. 3B is a longitudinal sectional view taken along line B-B in FIG. 2.

Here, an example in which p=8 is illustrated. As illustrated in FIG. 2, the through-switch TS1 includes eight MOSFETs T1 to T8, an antenna wiring LANT, a high-frequency signal wiring LRF1, and a pad PAD1.

The antenna wiring LANT is, for example, formed of metal, and extends in a first direction D1. An antenna pad which functions as the antenna terminal ANT and other through-switches TS2 to TS[n] are connected to the antenna wiring LANT.

The high-frequency signal wiring LRF1 is, for example, formed of metal, and extends in parallel with the antenna wiring LANT in the first direction D1.

The MOSFETs T1 to T8 are arranged in a second direction D2, and are connected in series between the antenna wiring LANT and the high-frequency signal wiring LRF1. Here, the second direction D2 is orthogonal to the first direction D1.

The pad PAD1 is formed of metal or the like, and is provided above one or more of first MOSFETs T1 to T3 (a first MOSFET group TG1) without being provided above second MOSFETs T4 to T8 (a second MOSFET group TG2), among the MOSFETs T1 to T8. Thus, the pad PAD1 overlaps (is above) a portion of the first MOSFETs T1 to T3. The pad PAD1 is connected to one end portion of the high-frequency signal wiring LRF1, and functions as the high-frequency signal terminal RF1. The pad PAD1 is provided above a source wiring LS and a drain wiring LD.

As illustrated in FIGS. 2, 3A, and 3B, each of the MOSFETs T1 to T8 includes a source region RS, a drain region RD, an insulating film 14, a gate electrode G1, a contact 15, the source wiring LS formed into a comb shape in planar view, and the drain wiring LD formed into a comb shape in planar view. Each of the MOSFETs T1 to T8 is arranged in a multi-finger type design. Note that, for the sake of clear description, the gate electrode G1 is not illustrated in FIG. 2, but its presence can be seen in FIGS. 3A and 3B.

In each of the MOSFETs T1 to T8, the source region RS and the drain region RD are provided on a surface of a semiconductor layer 13, which is formed of silicon or the like, provided on an insulating layer 12. The gate electrode G1 is provided on the semiconductor layer 13 between the source region RS and the drain region RD via the insulating film 14. The source region RS is connected to the source wiring LS through the contact 15. The drain region RD is connected to the drain wiring LD through the contact 15. Here, each respective contact 15 may be electrically distinct from other contacts 15—for example, contacts 15 connecting drain region RD to drain wiring LD are not directly connected to the contacts 15 connecting source region RS to source wiring LS. In addition, the insulating film 12 is in general provided on a support substrate (not specifically illustrated), and the support substrate, the insulating layer 12, and the semiconductor layer 13 form a SOI (silicon-on-insulator) substrate.

Each of the MOSFETs T1 to T8 has the same gate length and gate width. In each of the MOSFETs T1 to T8, the layout other than the source wiring LS and the drain wiring LD is substantially the same.

An interval d8 between the source wiring LS and the drain wiring LD in each of the second MOSFETs T4 to T8 is smaller than an interval d1 between the source wiring LS and the drain wiring LD in each of the first MOSFETs T1 to T3. Specifically, as illustrated in FIGS. 3A and 3B, a width w2 of the source wiring LS and the drain wiring LD in each of the second MOSFETs T4 to T8 is set to be greater than a width w1 of the source wiring LS and the drain wiring LD in each of the first MOSFETs T1 to T3, whereby the interval d8 is set to be smaller than the interval d1. Owing to this, the parasitic capacitance between the source wiring LS and the drain wiring LD in each of the second MOSFETs T4 to T8 becomes larger than the parasitic capacitance between the source wiring LS and the drain wiring LD in each of the first MOSFETs T1 to T3.

In a typical configuration, the pad PAD1 is provided on the high-frequency signal wiring LRF1 so as not to overlap any of the MOSFETs T1 to T8. For this reason, the size of the through-switch TS1 becomes larger than just the total, cumulative size of the MOSFETs T1 to T8 by the size of the pad PAD1. In comparison to such a configuration, in the present embodiment, it is possible to miniaturize a chip size of the semiconductor switch 1 by positioning of the pad PAD1 above some of the MOSFETS T1 to T8.

At least any of the through-switches TS2 to TS[n] may also have the same layout as that depicted for the through-switch TS1. Thus, it is possible to further reduce a chip size for the semiconductor switch 1 similarly providing one or more of the respective pad PAD[n] in an arrangement corresponding to pad PAD1.

Figure 4:
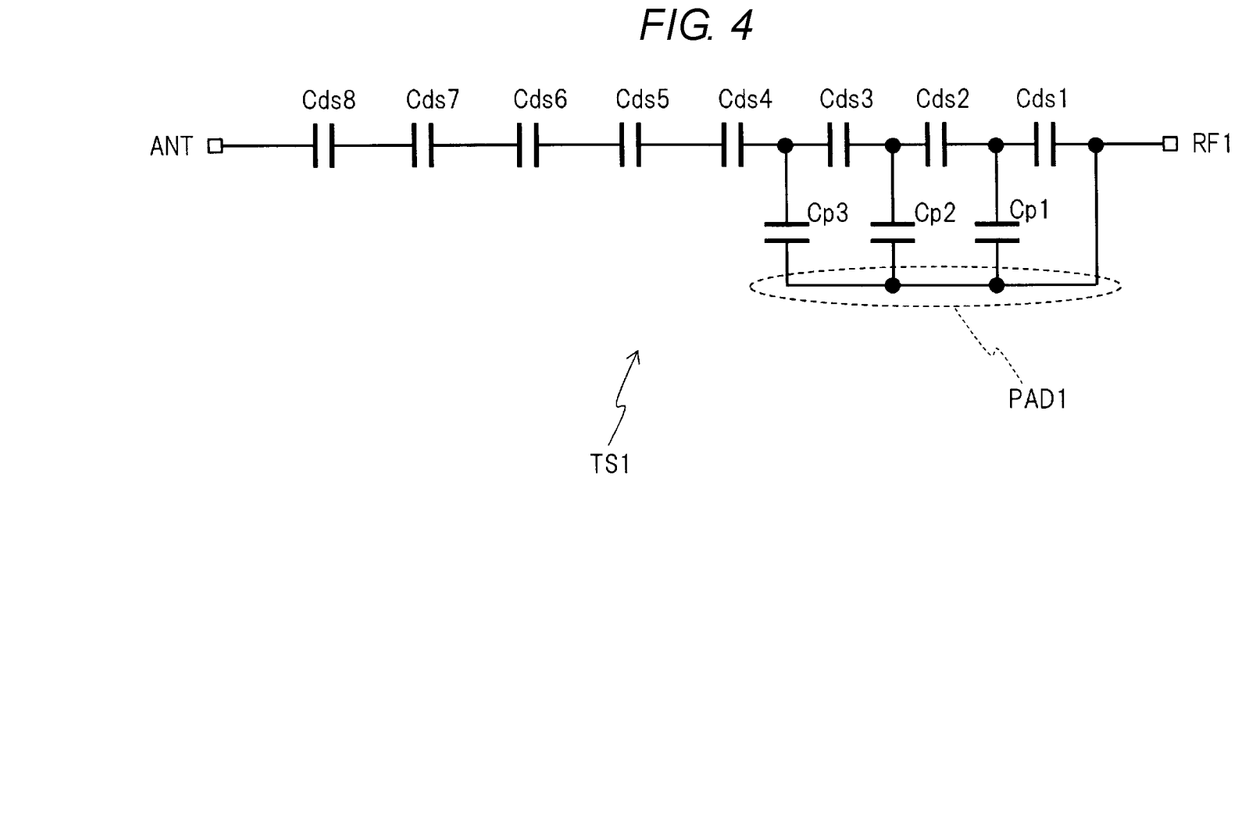
FIG. 4 is an equivalent circuit diagram in a state where the through-switch according to the first embodiment is turned off.

FIG. 4 is an equivalent circuit diagram in a state where the through-switch 1 illustrated in FIG. 2 is turned off (non-conducting between RF1 and ANT). The MOSFETs T1 to T8 in the off state are indicated by off capacitances Cds1 to Cds8. In addition, parasitic capacitances between the source wiring LS or the drain wiring LD, and the pad PAD1, in each of the MOSFETs T1 to T3 above which the pad PAD1 is provided are indicated by Cp1 to Cp3. That is, the off capacitances Cds1 to Cds8 do not include the parasitic capacitances Cp1 to Cp3 between the pad PAD1 and the MOSFETs T1 to T3, respectively.

The off capacitance Cds1 is the parasitic capacitance between the source and the drain of the first MOSFET T1 in the off state without the pad PAD1 being provided thereabove. That is, the off capacitance Cds1 includes the parasitic capacitance between the source wiring LS and the drain wiring LD of the first MOSFET T1 and the parasitic capacitance between a source region S1 and a drain region D1. The same is applicable for other off capacitances Cds2 to Cds8.

Accordingly, as illustrated in FIG. 4, the through-switch TS1 in the off state is indicated by an equivalent circuit in which the off capacitances Cds1 to Cds8 are connected in series between the antenna terminal ANT and the high-frequency signal terminal RF1, and the parasitic capacitances Cp1 to Cp3 are connected to each other. One end of the respective parasitic capacitances Cp1 to Cp3 is commonly connected to the high-frequency signal terminal RF1. The other end of the parasitic capacitance Cp1 is connected to a connection node between the off capacitances Cds1 and Cds2, the other end of the parasitic capacitance Cp2 is connected to a connection node between the off capacitances Cds2 and Cds3, and the other end of the parasitic capacitance Cp3 is connected to a connection node between the off capacitances Cds3 and Cds4.

Accordingly, owing to the parasitic capacitance Cp1, an actual off capacitance between the source and the drain of the first MOSFET T1 in the off state becomes greater than the off capacitance Cds1 (which is just for a case where the pad PAD1 is not provided above the first MOSFET T1). The same is applicable for the actual off capacitance between the source and the drain of the respective first MOSFETs T2 and T3 in the off state.

When the pad PAD1 is provided on the high-frequency signal wiring LRF1 so as not to overlap the MOSFETs T1 to T8, the parasitic capacitances Cp1 to Cp3 are not generated. Thus, when each of off capacitances Cds1 to Cds8 has the same value, a voltage is evenly applied between the high-frequency signal terminal RF1 and the antenna terminal ANT, and thus a voltage Vds between the source and the drain in each of the MOSFETs T1 to T8 in the off state have the same value.

On the other hand, in a case where each of off capacitances Cds1 to Cds8 has the same value in the case where the pad PAD1 is provided above the MOSFETs T1 to T3, the actual off capacitance between the source and the drain in each of the first MOSFETs T1 to T3 in the off state becomes larger than the value of the respective off capacitances Cds1 to Cds 8 by inclusion of the parasitic capacitances Cp1 to Cp3 in the actual off capacitance for the first MOSFETs T1 to T3. For this reason, the voltage would not be evenly applied between the high-frequency signal terminal RF1 and the antenna terminal ANT, and the voltage Vds between the source and the drain in each of the MOSFETs T1 to T8 in the off state does not have the same value. Specifically, the voltage Vds between the source and the drain in each of the second MOSFETs T4 to T8 becomes larger than the voltage Vds between the source and the drain in each of the first MOSFETs T1 to T3.

For example, when the size of the pad PAD1 is set as 70 μm square, the thickness of an interlayer insulating film between the source wiring LS (the drain wiring LD) and the pad PAD1 is set as 2 μm, and the relative permittivity of the interlayer insulating film is set as 4.1, the value of the respective parasitic capacitances Cp1 and Cp2 is about 30 fF and the value of the parasitic capacitance Cp3 is about 15 fF. In this case, when the value of the respective off capacitances Cds1 to Cds8 is set as 0.6 pF, the voltage Vds between the source and the drain in each of the second MOSFETs T4 to T8 (above which the pad PAD1 has not been provided), increases by about 5% in comparison to the case where the voltage is evenly applied. Accordingly, since the entire withstand voltage of the through-switch TS1 is decreased, the maximum allowable input power of the semiconductor switch 1 is reduced.

However, in the present embodiment, as described above, the parasitic capacitance between the source wiring LS and the drain wiring LD in each of the second MOSFETs T4 to T8 is set to be larger than the parasitic capacitance between the source wiring LS and the drain wiring LD in each of the first MOSFETs T1 to T3 by varying the interval distance (d1) between LS & LD for the first MOSFETs T1 to T3 to be less than the interval distance (d8) between LS & LD for the second MOSFETs T3 to T8. Accordingly, a value Coff1 of the respective off capacitance Cds1 to Cds3 in each of the first MOSFETs T1 to T3 without the pad PAD1 being provided is smaller than a value Coff2 of the respective off capacitances Cds4 to Cds8 in each of the second MOSFETs T4 to T8. The value Coff1 of the respective off capacitances Cds1 to Cds3 is substantially the same, and value Coff2 of the respective off capacitances Cds4 to Cds8 is substantially the same.

For example, in a case where the value Coff1 of the respective off capacitances Cds1 to Cds3 is 0.6 pF and the value Coff2 of the respective off capacitances Cds4 to Cds8 is 0.64 pF, an increasing amount of the voltage Vds between the source and the drain in each of the second MOSFETs T4 to T8 is decreased to 3% or less, the entire withstand voltage of the through-switch TS1 is thus improved. An optimal value of the value Coff2 of the respective off capacitances Cds4 to Cds8 can be changed depending on the value Coff1 of the respective off capacitances Cds1 to Cds3 and the value of the respective parasitic capacitances Cp1 to Cp3 (corresponding to values when the pad PAD1 is not provided above the first MOSFETs T1 to T3).

As illustrated above, according to the exemplary embodiment, the value Coff1 of the respective off capacitances Cds1 to Cds3 in the first MOSFETs T1 to T3 without the pad PAD1 being provided is set to be smaller than the value Coff2 of the respective off capacitances Cds4 to Cds8 in the second MOSFETs T4 to T8. Owing to this, even though the parasitic capacitances Cp1 to Cp3 exist due to presence of the pad PAD1 thereabove, it is possible to reduce the difference between the actual value of off capacitance between the source and the drain in each of the first MOSFETs T1 to T3 in the off state and the value Coff2 of the off capacitances Cds4 to Cds8. Accordingly, it is possible to reduce the difference in the value of the voltage Vds between the source and the drain in each of the MOSFETs T1 to T8 in the off state. Accordingly, since it is possible to prevent the off withstand voltage of the MOSFETs T1 to T8 from being decreased, it is possible to prevent the maximum allowable input power of the semiconductor switch 1 from being reduced. That is, it is possible to miniaturize the semiconductor switch 1 and prevent the deterioration of high frequency characteristics.

Second Embodiment

Figure 5:
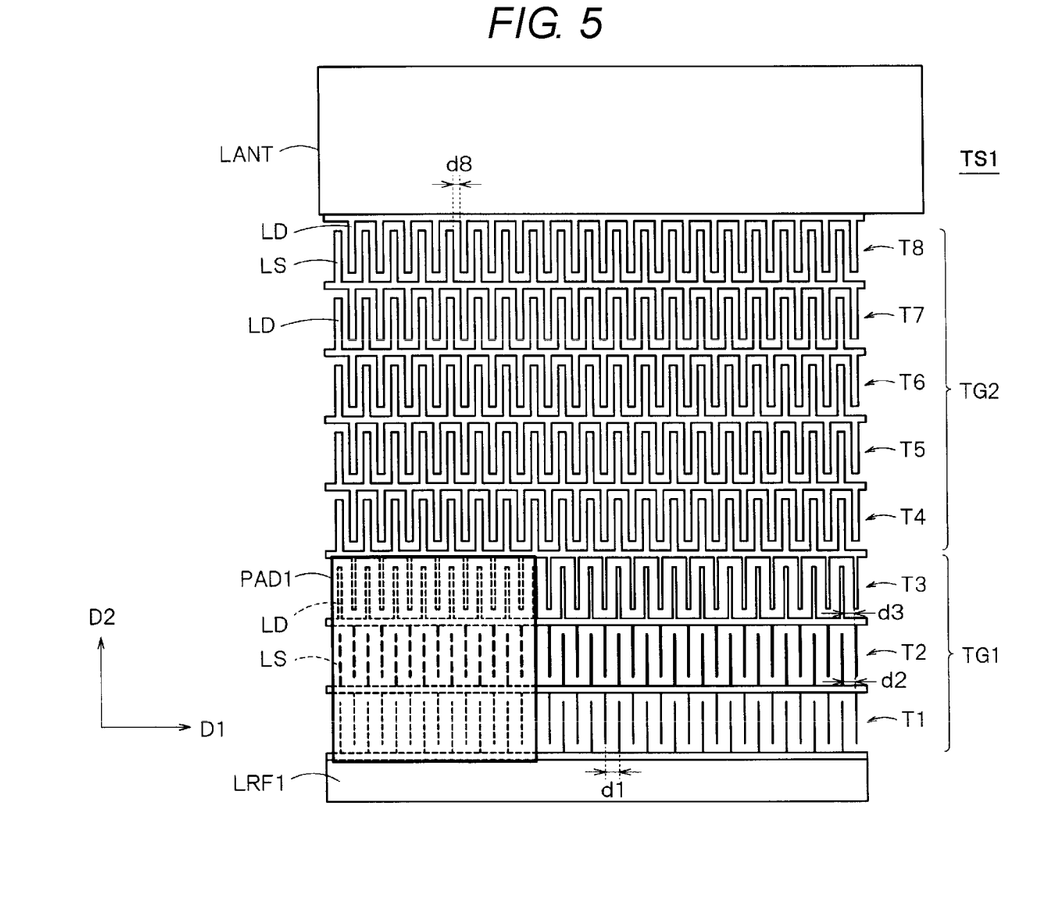
FIG. 5 is a plan view schematically illustrating the layout of the through-switch according to a second embodiment.

Unlike the first embodiment, the respective values of the off capacitances in the first MOSFETs T1 to T3 are different from each other rather than equal to each other. In the following description, differences from the first embodiment will be mainly described.

FIG. 5 is a plan view schematically illustrating the layout of through-switch TS1 according to a second embodiment. The pad PAD1 is provided above the m or more first MOSFETs T1 to T3 (where m is an integer of 2 or more). In an example illustrated in FIG. 5, m is set as 3.

The values of the off capacitances for the respective first MOSFETs T1 to T3 (i.e., values for the case in which the pad PAD1 has not been provided thereabove any portion) are set to be Coff1 to Coff (m) in an order from the high-frequency signal terminal RF1 (the high-frequency signal wiring LRF1), and values of the off capacitances in the respective second MOSFETs T4 to T8 are set to be Coff (m+1) so as to satisfy a relationship expressed by Coff1<Coff2< . . . <Coff (m)<Coff (m+1).

In the example illustrated in FIG. 5, relationship of Coff1<Coff2<Coff3<Coff4 to Coff8 is satisfied.

Specifically, the interval d8 between the source wiring LS and the drain wiring LD in each of the second MOSFETs T4 to T8 is smaller than the interval d1 between the source wiring LS and the drain wiring LD in the first MOSFET T1, the interval d2 between the source wiring LS and the drain wiring LD in the first MOSFET T2, and the interval d3 between the source wiring LS and the drain wiring LD in the first MOSFET T3. The interval d3 is smaller than the interval d2. The interval d2 is smaller than the interval d1. That is, among the first MOSFETs T1 to T3, the closer the MOSFET to the high-frequency signal wiring LRF1 is, the larger the interval between the source wiring LS and the drain wiring LD therein is.

In the first embodiment, among the first MOSFETs T1 to T3, as the first MOSFET is far from the high-frequency signal wiring LRF1, the influence of the parasitic capacitance of the pad PAD1 is reduced, and therefore, the actual off capacitance between the source and the drain in the off state is reduced. Accordingly, among the first MOSFETs T1 to T3, the far the first MOSFET from the high-frequency signal wiring LRF1 is, the greater the voltage Vds between the source and the drain in the off state is.

In contrast, in the second embodiment, among the first MOSFETs T1 to T3, the farther the first MOSFET from the high-frequency signal wiring LRF1 is, the larger the value of off capacitance in the case where the pad PAD1 is not provided is, and thus it is possible to adjust to the actual off capacitance between the source and the drain in each of the first MOSFETs T1 to T3 to be similar. For this reason, in comparison to the first embodiment, it is possible to reduce the difference in value of the voltage Vds between the source and the drain in each of the MOSFETs T1 to T8 in the off state. For example, in a case where the Coff1 is set as 0.6 pF, the Coff2 is set as 0.63 pF, the Coff3 is set as 0.69 pF, and the Coff4 to Coff8 are set as 0.73 pF, it is possible to have the voltage Vds between the source and the drain in each of the MOSFETs T1 to T8 in the off state be the same or substantially the same value.

Accordingly, in comparison to the first embodiment, since it is possible to prevent the off withstand voltage of the MOSFETs T1 to T8 from being decreased, it is possible to prevent the maximum allowable input power of the semiconductor switch 1 from being reduced.

Third Embodiment

Unlike the first embodiment, in the third embodiment, the value of the off capacitance becomes different, since the source wiring LS and the drain wiring LD have the different thickness from each other rather than different interval spacing. In the following description, differences from the first embodiment will be mainly described.

Figure 6A:
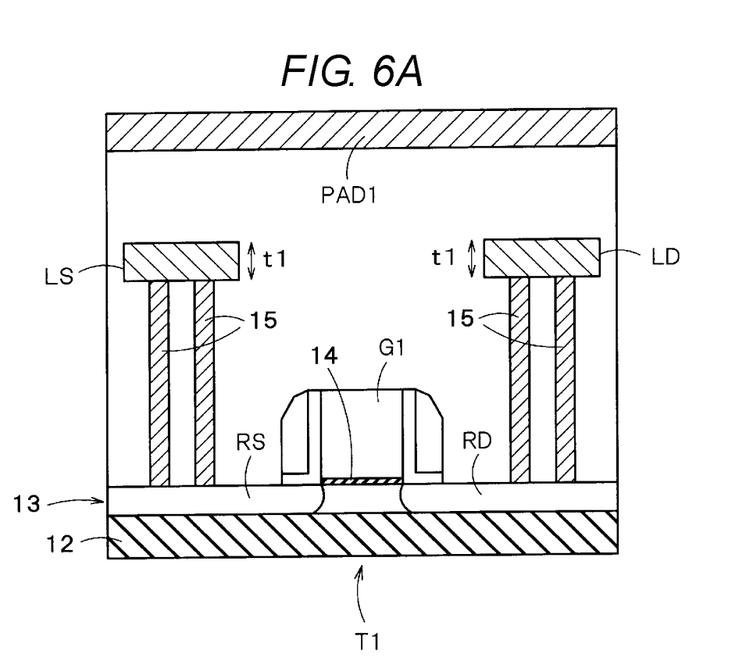
FIG. 6A is a cross sectional view corresponding to a first MOSFET T1 illustrated in FIG. 3A according to a third embodiment.
Figure 6B:
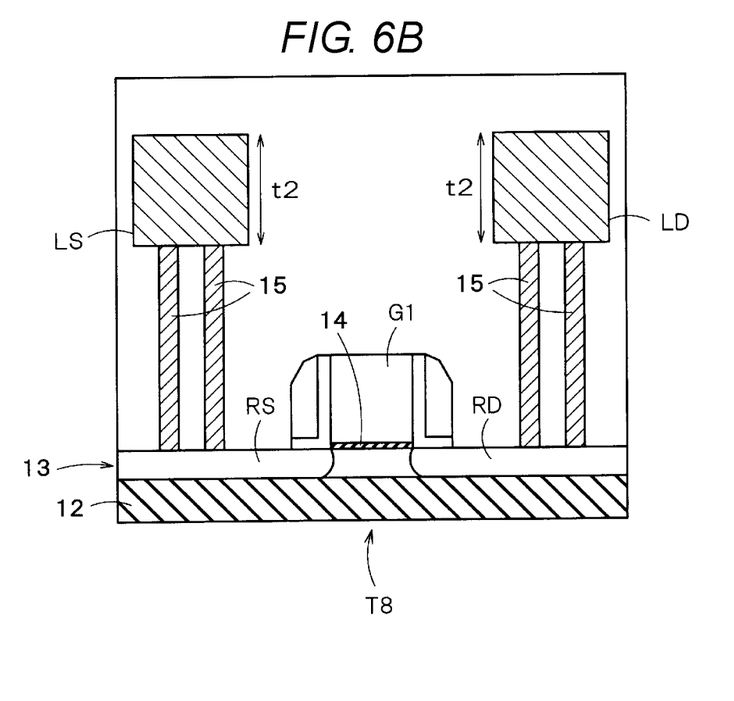
FIG. 6B is a cross sectional view corresponding to a second MOSFET T8 illustrated in FIG. 3B according to the third embodiment.

FIG. 6A is a longitudinal sectional view corresponding to the first MOSFET T1 illustrated in FIG. 3A according to the third embodiment, and FIG. 6B is a longitudinal sectional view corresponding to the second MOSFET T8 illustrated in FIG. 3B according to the third embodiment. The configurations of the first MOSFETs T1 to T3 are substantially the same as each other, and the configurations of the second MOSFETs T4 to T8 are substantially the same as each other. As illustrated in FIGS. 6A and 6B, the thickness t2 of each of the source wiring LS and the drain wiring LD in each of the second MOSFETs T4 to T8 is greater than the thickness t1 of each of the source wiring LS and the drain wiring LD in each of the first MOSFETs T1 to T3.

Unlike the first embodiment, an interval between the source wiring LS and the drain wiring LD is the same in each of the MOSFETs T1 to T8.

Owing to this configuration, the parasitic capacitance between the source wiring LS and the drain wiring LD in each of the second MOSFETs T4 to T8 becomes larger than the parasitic capacitance between the source wiring LS and the drain wiring LD in each of the first MOSFETs T1 to T3. Therefore, it is possible to obtain the same effect as that in the first embodiment.

Note that, the third embodiment may be applied to the second embodiment. In other words, in the second embodiment, the thickness of each of the source wiring LS and the drain wiring LD may be changed in such a manner that the interval between the source wiring LS and the drain wiring LD is the same so as to satisfy the relationship of the value of the off capacitance in the second embodiment.

Fourth Embodiment

Unlike the first embodiment, in the fourth embodiment, the values of the off capacitances are different from each other due to the difference of the number of layers of the wiring. In the following description, differences from the first embodiment will be mainly described.

Figure 7A:
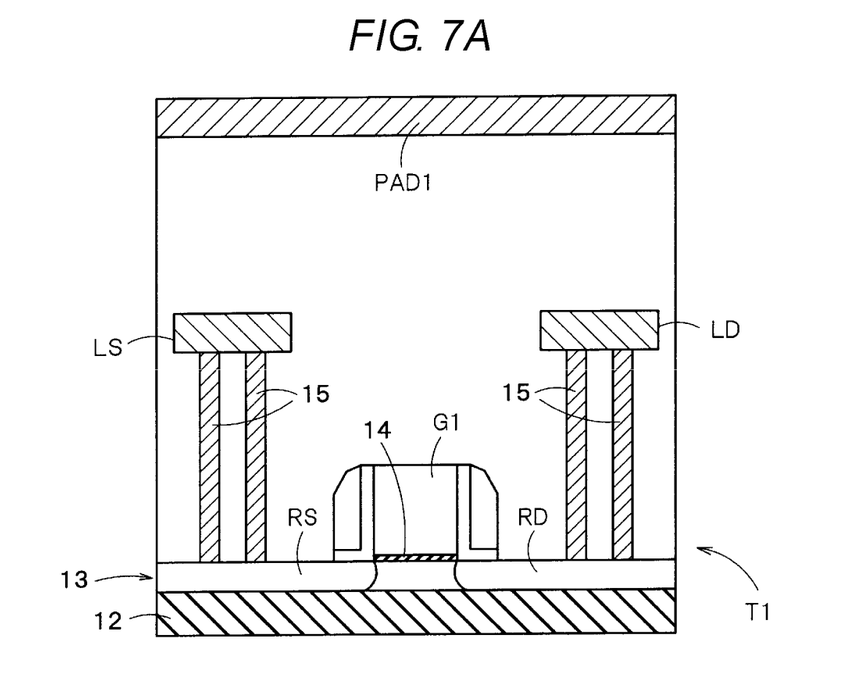
FIG. 7A is a cross sectional view corresponding to a first MOSFET T1 illustrated in FIG. 3A according to a fourth embodiment.
Figure 7B:
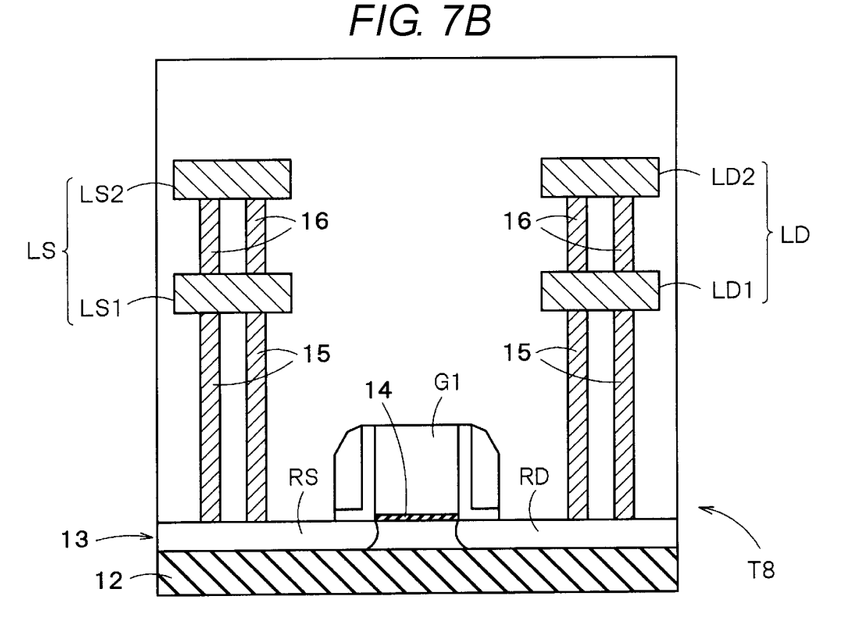
FIG. 7B is a cross sectional view corresponding to a second MOSFET T8 illustrated in FIG. 3B according to the fourth embodiment.

FIG. 7A is a longitudinal sectional view corresponding to the first MOSFET T1 illustrated in FIG. 3A according to the fourth embodiment, and FIG. 7B is a longitudinal sectional view corresponding to the second MOSFET T8 illustrated in FIG. 3B according to the fourth embodiment. The configurations of the first MOSFETs T1 to T3 are substantially the same as each other, and the configurations of the second MOSFETs T4 to T8 are substantially the same as each other. As illustrated in FIGS. 7A and 7B, the number of layers of each of the source wiring LS and the drain wiring LD in each of the second MOSFETs T4 to T8 is greater than the number of layers of each of the source wiring LS and the drain wiring LD in each of the first MOSFETs T1 to T3.

In the example illustrated in FIGS. 7A and 7B, the source wiring LS and the drain wiring LD in the first MOSFET T1 respectively have a single layer of wiring, whereas the source wiring LS and the drain wiring LD in the second MOSFET T8 respectively have double layers of wiring. In other words, in the second MOSFET T8, the source wiring LS includes a lower layer of a source wiring LS1 and an upper layer of a source wiring LS2, and the drain wiring LD includes a lower layer of a drain wiring LD1 and an upper layer of a drain wiring LD2. In an example illustrated in FIGS. 7A and 7B, the thickness of each of the source wiring LS and the drain wiring LD in the first MOSFET T1 is the same as the thickness of each of the source wirings LS1 and LS2 and each of the drain wirings LD1 and LD2 in the second MOSFET T8. The thickness of each of the lower layers of the source wiring LS1 and the drain wiring LD1 may be different from the thickness of the each of the upper layers of the source wiring LS2 and the drain wiring LD2.

In the second MOSFET T8, the lower layer of the source wiring LS1 and the upper layer of the source wiring LS2 are connected to each other through a via 16. In the same way, the lower layer of the drain wiring LD1 and the upper layer of the drain wiring LD2 is connected to each other through the via 16. The upper layer of the source wiring LS2 and the upper layer of the drain wiring LD2 are provided below the pad PAD1.

Unlike the first embodiment, an interval between the source wiring LS and the drain wiring LD is the same in each of the MOSFETs T1 to T8.

Owing to this configuration, the parasitic capacitance between the source wiring LS and the drain wiring LD in each of the second MOSFETs T4 to T8 becomes larger than the parasitic capacitance between the source wiring LS and the drain wiring LD in each of the first MOSFETs T1 to T3. Therefore, it is possible to obtain the same effect as that in the first embodiment.

Note that, the fourth embodiment may be applied to the second embodiment. In other words, in the second embodiment, the number of layers of each of the source wiring LS and the drain wiring LD may be changed in such a manner that the interval between the source wiring LS and the drain wiring LD is the same so as to satisfy the relationship of the value of the off capacitance in the second embodiment.

Fifth Embodiment

Unlike the first embodiment, in the fifth embodiment, the value of the off capacitance is made different by connecting a capacitive element between the source and the drain in each of the second MOSFETs T4 to T8. In the following description, differences from the first embodiment will be mainly described.

Figure 8:
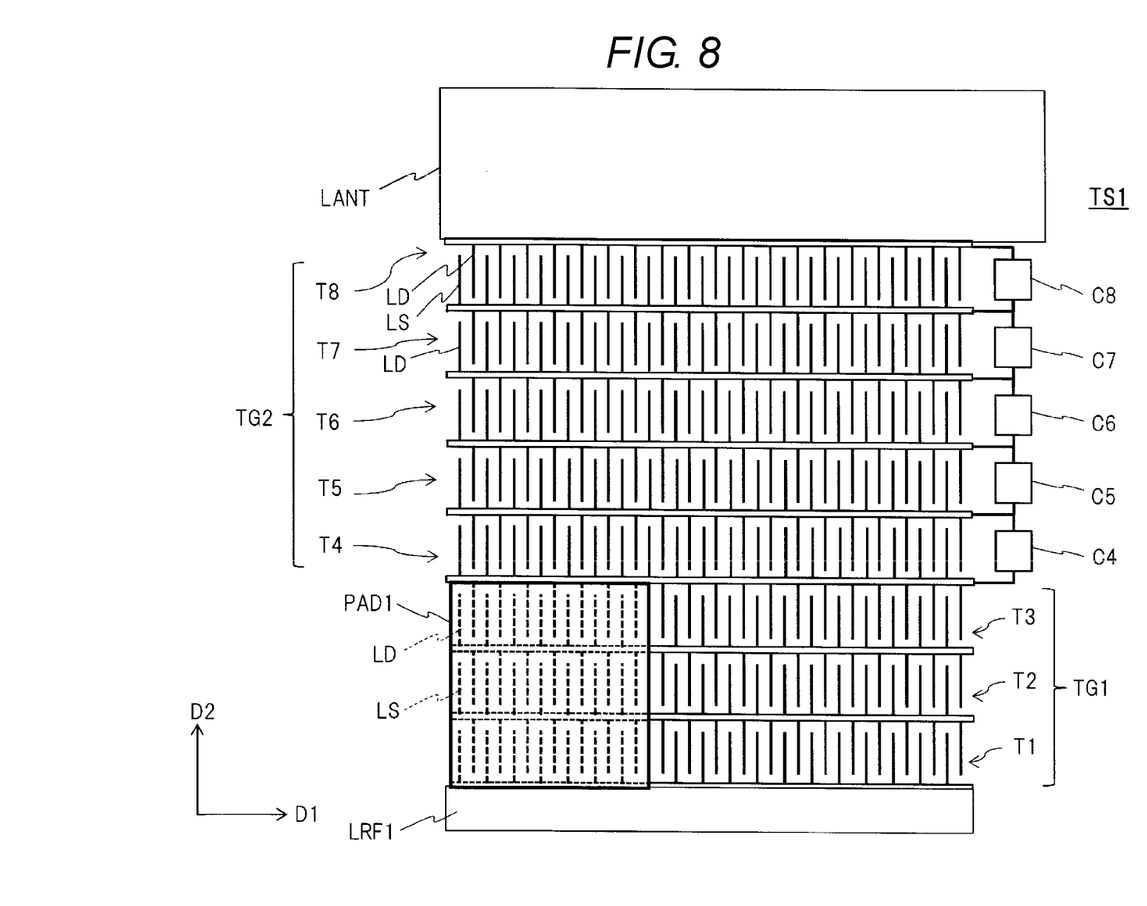
FIG. 8 is a plan view schematically illustrating a layout of a through-switch according to a fifth embodiment.

FIG. 8 is a plan view schematically illustrating the layout of the through-switch TS1 according to a fifth embodiment. As illustrated in FIG. 8, the through-switch TS1 includes the first capacitive elements (capacitors) C4 to C8 each of which is connected between the source and the drain in each of the second MOSFETs T4 to T8. The capacitance values of the first capacitive elements C4 to C8 are the same as each other. Each of the first capacitive elements C4 to C8 is formed of two planar electrodes which are stacked with the insulating layer interposed therebetween.

Unlike the first embodiment, an interval between the source wiring LS and the drain wiring LD is the same in each of the MOSFETs T1 to T8. In addition, the MOSFETs T1 to T8 have the same layout.

Owing to this configuration, the parasitic capacitance between the source wiring LS and the drain wiring LD in each of the second MOSFETs T4 to T8 becomes larger than the parasitic capacitance between the source wiring LS and the drain wiring LD in each of the first MOSFETs T1 to T3. Therefore, it is possible to obtain the same effect as that in the first embodiment.

In addition, according to the exemplary embodiment, it is possible to calculate the capacitance value based on the region of the planar electrode which forms the first capacitive elements C4 to C8 and the distance between the planar electrodes, and thus it may be easily calculated as compared with the first embodiment.

Sixth Embodiment

Unlike the fifth embodiment, in the sixth embodiment, the value of the off capacitance is made different by connecting a capacitive element between the source and the drain in each of the first MOSFETs T2 and T3. In the following description, differences from the fifth embodiment will be mainly described.

Figure 9:
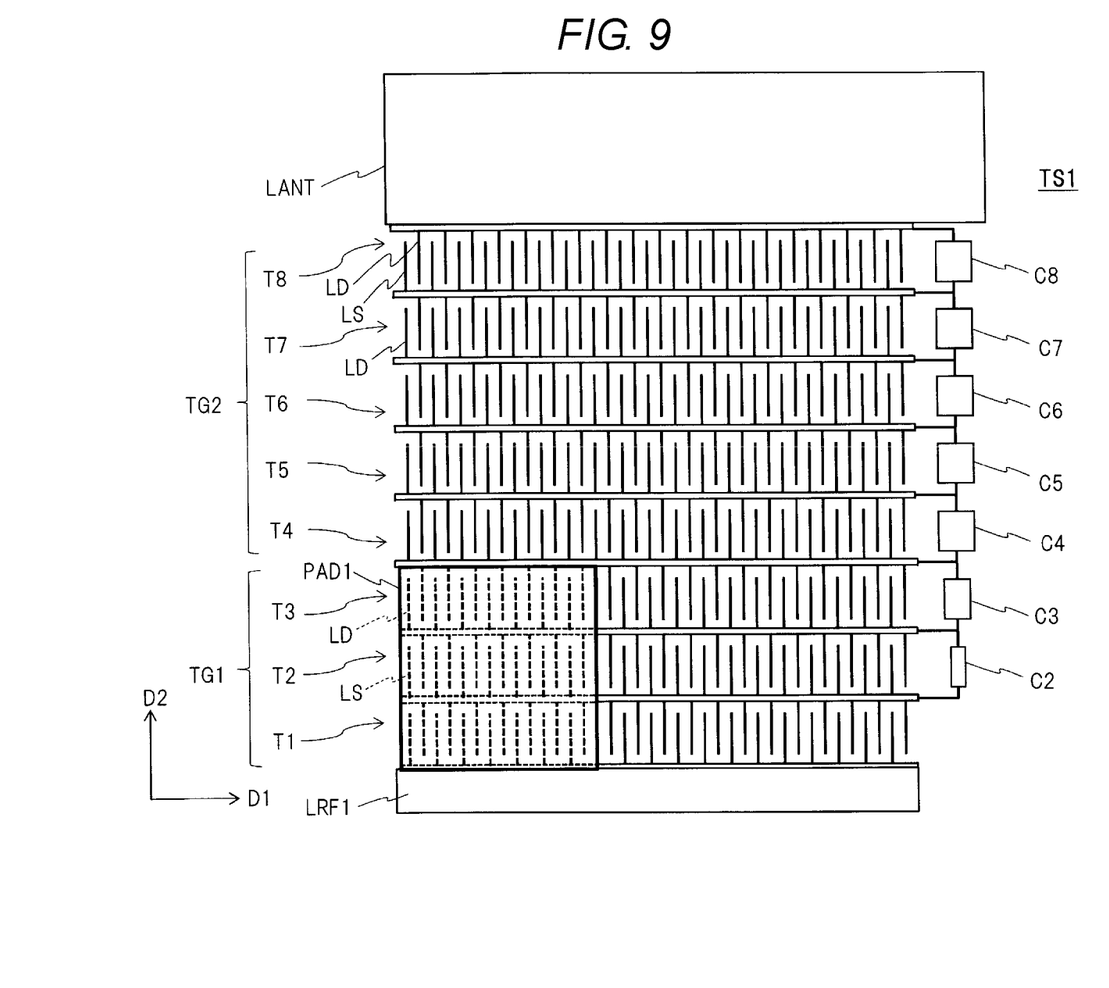
FIG. 9 is a plan view schematically illustrating a layout of a through-switch according to a sixth embodiment.

FIG. 9 is a plan view schematically illustrating a layout of a through-switch TS1 according to a sixth embodiment. As illustrated in FIG. 9, in addition to the configuration of FIG. 8, the through-switch TS1 includes the second capacitive (capacitance) elements C2 and C3 each of which is connected between the source and the drain in each of one or more of first MOSFETs T2 and T3, and of which the capacitance values are smaller than those of the first capacitive elements C4 to C8. The capacitance values of the second capacitive elements C2 and C3 are different from each other. The relationship of the capacitance value satisfies C2<C3<C4 to C8.

Owing to this configuration, the value of the off capacitance in the case where the pad PAD1 is not provided may satisfy the relationship expressed by Coff1<Coff2<Coff3<Coff4 to Coff8, and thus it is possible to obtain the same effect as that in the second embodiment.

In addition, the capacitance value may be easily calculated as compared to the second embodiment.

Seventh Embodiment

Unlike the first embodiment, in the seventh embodiment, the values of the off capacitances are different from each other due to the difference of the gate length. In the following description, differences from the first embodiment will be mainly described.

Figure 10A:
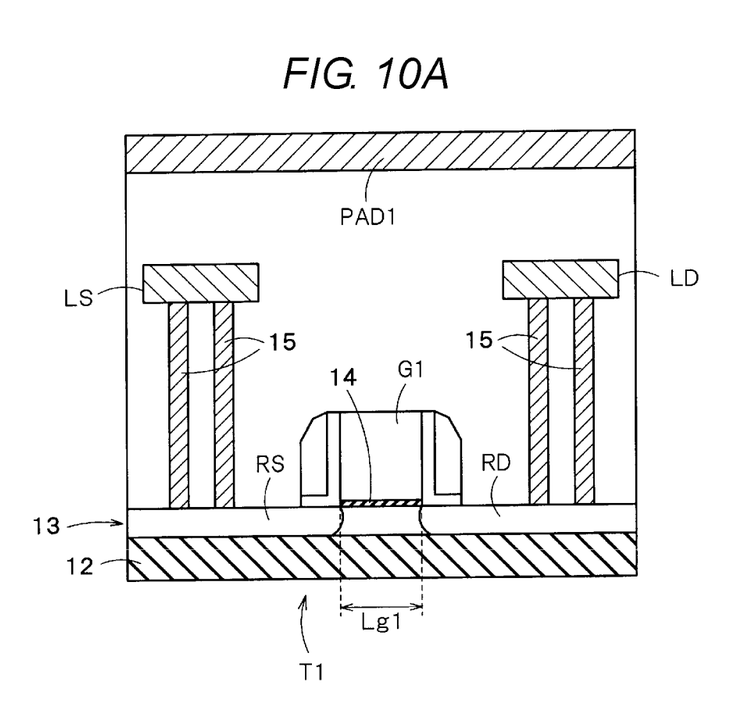
FIG. 10A is a cross sectional view corresponding to a first MOSFET T1 illustrated in FIG. 3A according to a seventh embodiment.
Figure 10B:
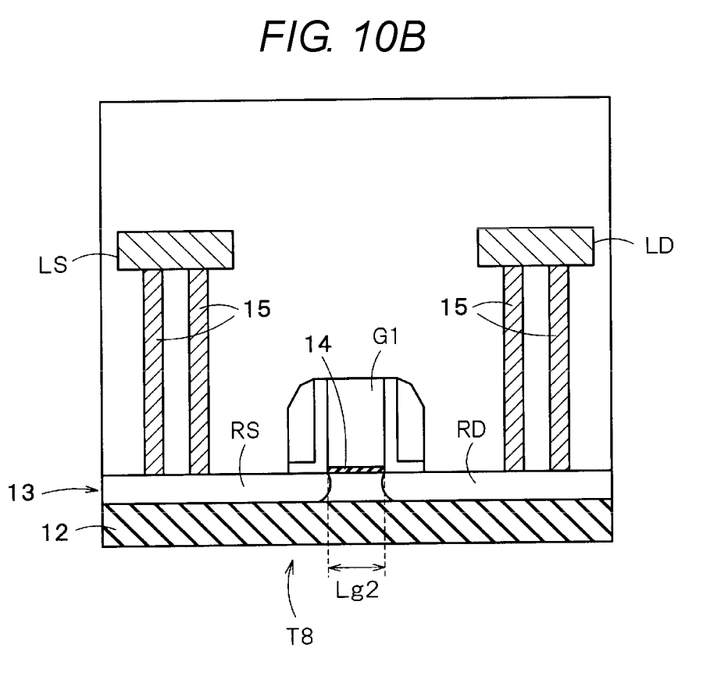
FIG. 10B is a cross sectional view corresponding to a second MOSFET T8 illustrated in FIG. 3B according to the seventh embodiment.

FIG. 10A is a longitudinal sectional view corresponding to the first MOSFET T1 illustrated in FIG. 3A according to the seventh embodiment, and FIG. 10B is a longitudinal sectional view corresponding to the second MOSFET T8 illustrated in FIG. 3B according to the seventh embodiment. The configurations of the first MOSFETs T1 to T3 are substantially the same as each other, and the configurations of the second MOSFETs T4 to T8 are substantially the same as each other. As illustrated in FIGS. 10A and 10B, a gate length Lg2 in each of the second MOSFETs T4 to T8 is shorter than a gate length Lg1 in each of the first MOSFETs T1 to T3. Unlike the first embodiment, an interval between the source wiring LS and the drain wiring LD is the same in each of the MOSFETs T1 to T8.

In short, the distance (substantially the gate length Lg2) between the source region RS and the drain region RD in each of the second MOSFETs T4 to T8 is shorter than the distance (substantially the gate length Lg1) between the source region RS and the drain region RD in each of the first MOSFETs T1 to T3.

Accordingly, the parasitic capacitance between the source region RS and the drain region RD in each of the second MOSFETs T4 to T8 becomes larger than the parasitic capacitance between the source region RS and the drain region RD in each of the first MOSFETs T1 to T3. Therefore, it is possible to obtain the same effect as that in the first embodiment.

Note that, the seventh embodiment may be applied to the second embodiment. In other words, in the second embodiment, the gate length of each of the source wiring LS and the drain wiring LD may be changed in such a manner that the interval between the source wiring LS and the drain wiring LD is the same so as to satisfy the relationship of the value of the off capacitance in the second embodiment.

Eighth Embodiment

Unlike the first embodiment, in the eighth embodiment, the values of the off capacitances are different from each other due to the difference of a gate width.

Figure 11:
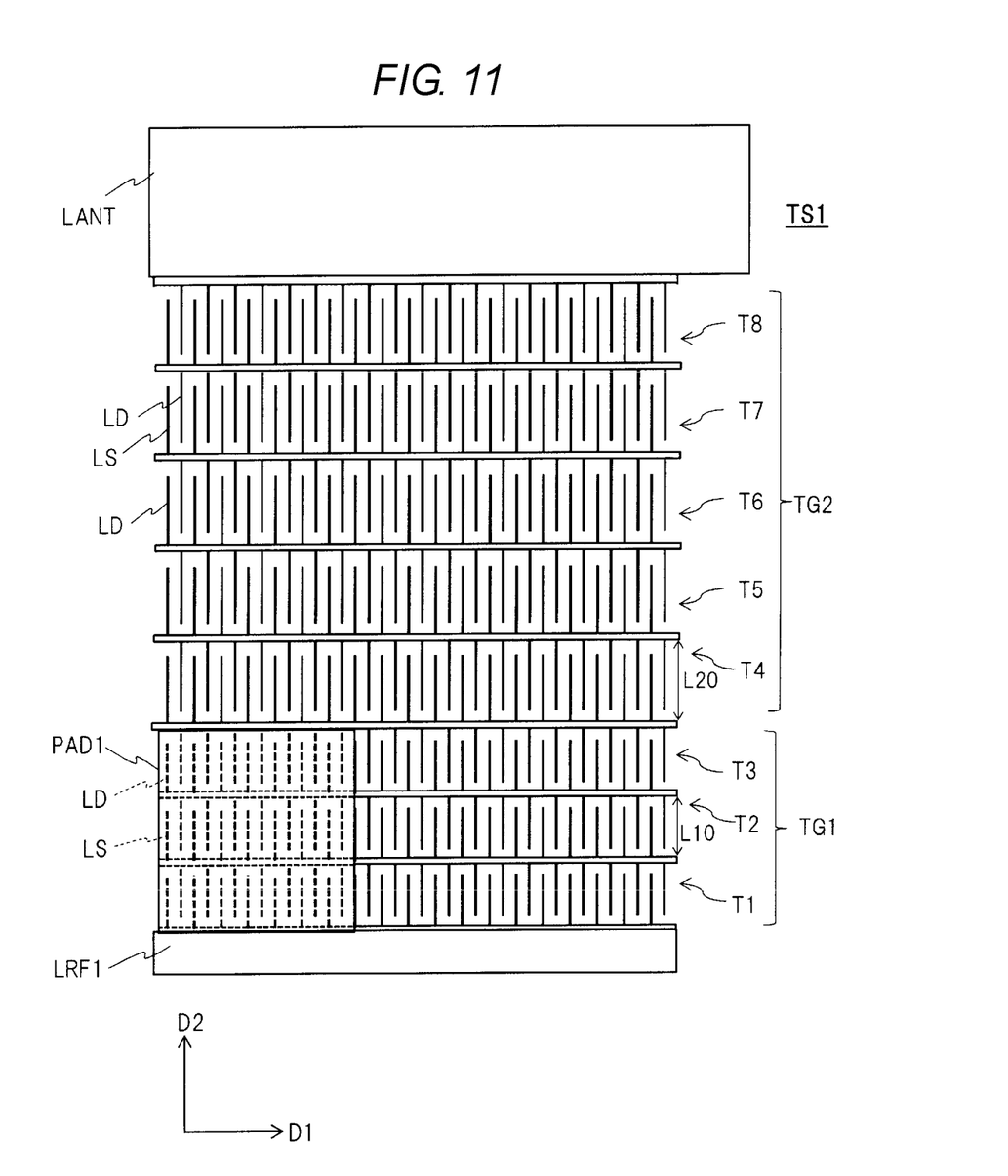
FIG. 11 is a plan view schematically illustrating a layout of a through-switch according to an eighth embodiment.

FIG. 11 is a plan view schematically illustrating a layout of a through-switch TS1 according to the eighth embodiment. As illustrated in FIG. 11, the gate width (the overall gate width) of each of the second MOSFETs T4 to T8 is greater than the gate width (the overall gate width) of each of the first MOSFETs T1 to T3. That is, a length L20 of each of the second MOSFETs T4 to T8 in the second direction D2 is longer than a length L10 of each of the first MOSFETs T1 to T3 in the second direction D2.

As a result, the length of each of the source wiring LS and the drain wiring LD in each of the second MOSFETs T4 to T8 in the second direction D2 is also longer than the length of each of the source wiring LS and the drain wiring LD in each of the first MOSFETs T1 to T3 in the second direction D2.

Unlike the first embodiment, an interval between the source wiring LS and the drain wiring LD is the same in each of the MOSFETs T1 to T8.

Accordingly, the parasitic capacitance between the source region RS and the drain region RD in each of the second MOSFETs T4 to T8 becomes larger than the parasitic capacitance between the source region RS and the drain region RD in each of the first MOSFETs T1 to T3.

In addition, the parasitic capacitance between the source wiring LS and the drain wiring LD in each of the second MOSFETs T4 to T8 becomes larger than the parasitic capacitance between the source wiring LS and the drain wiring LD in each of the first MOSFETs T1 to T3. Therefore, it is possible to obtain the same effect as that in the first embodiment.

Note that, the eighth embodiment may be applied to the second embodiment. In other words, in the second embodiment, the gate width of each of the source wiring LS and the drain wiring LD may be changed in such a manner that the interval between the source wiring LS and the drain wiring LD is the same so as to satisfy the relationship of the value of the off capacitance in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch, comprising:
   a first pad connected to a first node; and
   a plurality of metal-oxide-semiconductor field effect transistors (MOSFETs) connected in series between the first node and a second node, a first MOSFET in the plurality of MOSFETs being connected between the first node and a second MOSFET in the plurality of MOSFETs, the first pad being disposed above the first MOSFET, wherein
   a first off state capacitance of the first MOSFET that is determined without consideration of any parasitic capacitance between the first MOSFET and the first pad is less than a second off state capacitance of the second MOSFET that is determined without consideration of any parasitic capacitance between the second MOSFET and the first pad.

2. The switch according to claim 1, wherein the first pad is above the second MOSFET.

3. The switch according to claim 1, wherein the first pad is not above the second MOSFET.

4. The switch according to claim 3, wherein at least one MOSFET in the plurality of MOSFETs is connected between the first and second MOSFETs, and the first pad is above the at least one MOSFET and the first MOSFET.

5. The switch according to claim 4, wherein an off state capacitance of the at least one MOSFET determined without consideration of any parasitic capacitance between said at least one MOSFET and the first pad is less than the second off state capacitance and greater than the first off state capacitance.

6. The switch according to claim 4, wherein an off state capacitance of the at least one MOSFET determined without consideration of any parasitic capacitance between said at least one MOSFET and the first pad is less than the second off state capacitance and equal to the first off state capacitance.

7. The switch according to claim 1, wherein the plurality of MOSFETs includes a first and second plurality of MOSFETs, the first plurality being connected in series between the first node and the second plurality, the second plurality being connected in series between the first plurality and the second node, the first pad being above the first plurality and not above the second plurality, each MOSFET in the first plurality having an off state capacitance determined without consideration of any parasitic capacitance between the first pad and the respective MOSFET that is less than an off state capacitance of every respective MOSFET in the second plurality.

8. The switch according to claim 7, further comprising:
   a plurality of first capacitive elements respectively connected between a source and a drain of each MOSFET in the second plurality of MOSFETs, each first capacitive element having a first capacitance value.

9. The switch according to claim 8, further comprising:
   a plurality of second capacitive elements respectively connected between a source and drain of each MOSFET in the first plurality of MOSFETs other than the MOSFET directly connected to the first node, each second capacitive element having a capacitance value that is less than the first capacitance value.

10. The switch according to claim 1, wherein the first pad is provided above at the first MOSFET and a third MOSFET in the plurality of MOSFETs that is adjacent to the first MOSFET and between the first and second MOSFETs, the third MOSFET having a third off state capacitance that is determined without consideration of any parasitic capacitance between the third MOSFET and the first pad that is greater than or equal to the first off state capacitance and less than the second off state capacitance.

11. The switch according to claim 10, wherein the third off state capacitance is greater than the first off state capacitance.

12. The switch according to claim 1, wherein
the first MOSFET and the second MOSFET each includes a source wiring and a drain wiring, and
an interval between the source wiring and the drain wiring in the second MOSFET is smaller than an interval between the source wiring and the drain wiring in the first MOSFET.

13. The switch according to claim 1, wherein
the first MOSFET and the second MOSFET each includes a source wiring and a drain wiring, and
a thickness of the source wiring and the drain wiring in the second MOSFET is greater than a thickness the source wiring and the drain wiring in the first MOSFET.

14. The switch according to claim 1, wherein
the first MOSFET and the second MOSFET each includes a source wiring and a drain wiring, and
a number of layers of the source wiring and the drain wiring in the second MOSFET is greater than a number of layers of the source wiring and the drain wiring in the first MOSFET.

15. The switch according to claim 1, wherein a gate length of the second MOSFET is shorter than a gate length of the first MOSFET.

16. The switch according to claim 1, wherein a gate width of the second MOSFET is greater than a gate width of the first MOSFET.

17. A semiconductor switch, comprising:
a plurality of metal-oxide-semiconductor field effect transistors (MOSFETs) connected in series between a common node and a first node; and
a first pad connected to the first node and disposed above a first group of MOSFETs from the plurality of MOSFETs, the first group including a first MOSFET directly connected to the first node, the first pad not disposed above a second group of MOSFETs from the plurality of MOSFETs, wherein
each MOSFET in the plurality of MOSFETs includes a source wiring and a drain wiring, and
an interval between the source wiring and the drain wiring for each MOSFET in the second group of MOSFETs is smaller than an interval between the source wiring and the drain wiring for each MOSFET in the first group of MOSFETs.

18. The switch according to claim 17, wherein the interval between the source wiring and the drain wiring for each MOSFET in the first group of MOSFETs is different with the interval for the first MOSFET being smaller than any other MOSFET in the plurality of MOSFETs.

19. A semiconductor switch, comprising:
a plurality of metal-oxide-semiconductor field effect transistors (MOSFETs) connected in series between a common node and a first node; and
a first pad connected to the first node and disposed above a first group of MOSFETs from the plurality of MOSFETs, the first group including a first MOSFET directly connected to the first node, the first pad not disposed above a second group of MOSFETs from the plurality of MOSFETs, wherein
each MOSFET in the plurality of MOSFETs includes a source wiring and a drain wiring, and
a number of layers of the source wiring and the drain wiring for each MOSFET in the second group of MOSFETs is greater than a number of layers of the source wiring and the drain wiring for each MOSFET in the first group of MOSFETs.

20. The switch according to claim 19, wherein the number of layers for each MOSFET in the first group of MOSFETs is the same.

* * * * *